US012641879B2

(12) United States Patent
Bae et al.

(10) Patent No.: US 12,641,879 B2
(45) Date of Patent: May 26, 2026

(54) ORGANIC LIGHT EMITTING DIODE DISPLAY

(71) Applicant: Samsung Display Co., Ltd., Yongin-si (KR)

(72) Inventors: Joon Woo Bae, Hwaseong-si (KR); So Young Koo, Yongin-si (KR); Han Bit Kim, Seoul (KR); Thanh Tien Nguyen, Seoul (KR); Kyoung Won Lee, Seoul (KR); Yong Su Lee, Seoul (KR); Jae Seob Lee, Seoul (KR); Gyoo Chul Jo, Suwon-si (KR)

(73) Assignee: Samsung Display Co., Ltd., Yongin-Si (KR)

( * ) Notice: Subject to any disclaimer, the term of this patent is extended or adjusted under 35 U.S.C. 154(b) by 0 days.

(21) Appl. No.: 18/505,778

(22) Filed: Nov. 9, 2023

(65) Prior Publication Data

US 2024/0081099 A1 Mar. 7, 2024

Related U.S. Application Data

(63) Continuation of application No. 17/572,913, filed on Jan. 11, 2022, now Pat. No. 11,856,818, which is a (Continued)

(30) Foreign Application Priority Data

Oct. 5, 2018 (KR) ........................ 10-2018-0118769

(51) Int. Cl.
*H10D 86/40* (2025.01)
*H10D 30/67* (2025.01)
(Continued)

(52) U.S. Cl.
CPC ....... *H10D 86/423* (2025.01); *H10K 59/1213* (2023.02); *H10K 59/1216* (2023.02);
(Continued)

(58) Field of Classification Search
CPC ............. H10K 59/873; H10K 59/1216; H10K 59/126; H10K 59/1213; H10K 59/131;
(Continued)

(56) References Cited

U.S. PATENT DOCUMENTS 7,507,998 B2 3/2009 Tseng
9,299,761 B2 3/2016 Seo et al.
(Continued)

FOREIGN PATENT DOCUMENTS

CN 105789244 7/2016
CN 108511462 9/2018
(Continued)

OTHER PUBLICATIONS

Mallory Mativenga et al., "Bulk Accumulation a-IGZO TFT for High Current and Turn-on Voltage Uniformity", IEEE Electron Device Letters, Dec. 2013, pp. 1533-1535, vol. 34, No. 12.
(Continued)

*Primary Examiner* — Vongsavanh Sengdara
(74) *Attorney, Agent, or Firm* — Innovation Counsel LLP

(57) ABSTRACT

An organic light emitting diode display according to an exemplary embodiment includes: a substrate; a first buffer layer on the substrate; a first semiconductor layer on the first buffer layer; a first gate insulating layer on the first semiconductor layer; a first gate electrode and a blocking layer on the first gate insulating layer; a second buffer layer on the first gate electrode; a second semiconductor layer on the second buffer layer; a second gate insulating layer on the second semiconductor layer; and a second gate electrode on the second gate insulating layer.

18 Claims, 7 Drawing Sheets

Related U.S. Application Data continuation of application No. 16/591,966, filed on Oct. 3, 2019, now Pat. No. 11,257,886.

(51) Int. Cl.

| | |
|---|---|
| *H10D 86/60* | (2025.01) |
| *H10K 59/121* | (2023.01) |
| *H10K 59/126* | (2023.01) |
| *H10K 59/131* | (2023.01) |
| *H10K 59/80* | (2023.01) |

(52) U.S. Cl.
CPC ......... *H10K 59/126* (2023.02); *H10K 59/131* (2023.02); *H10K 59/873* (2023.02); *H10D 30/6723* (2025.01); *H10D 30/6731* (2025.01); *H10D 30/6745* (2025.01); *H10D 30/6755* (2025.01); *H10D 86/441* (2025.01); *H10D 86/481* (2025.01); *H10D 86/60* (2025.01)

(58) Field of Classification Search
CPC .. H10K 50/844; H10K 59/124; H10D 86/423; H10D 86/441; H10D 86/60; H10D 86/481; H10D 30/6745; H10D 30/6723; H10D 30/6755; H10D 30/6731
See application file for complete search history.

(56) References Cited

U.S. PATENT DOCUMENTS

| | | | |
|---|---|---|---|
| 9,324,740 B2 | 4/2016 | Lee et al. | |
| 9,331,101 B2 | 5/2016 | Park et al. | |
| 9,484,395 B2 | 11/2016 | Park et al. | |
| 9,601,556 B2 | 3/2017 | Seo et al. | |
| 9,941,169 B2 | 4/2018 | Lee et al. | |
| 10,083,990 B2 | 9/2018 | Oh et al. | |
| 10,340,472 B2 | 7/2019 | Kim et al. | |
| 10,629,488 B2 | 4/2020 | Lee et al. | |
| 10,985,068 B2 | 4/2021 | Lee et al. | |
| 2010/0252880 A1* | 10/2010 | Stribley | H10D 1/66 257/E21.135 |
| 2011/0101351 A1 | 5/2011 | Yamazaki | |
| 2011/0169105 A1 | 7/2011 | Okubo | |
| 2012/0063208 A1* | 3/2012 | Koyama | G11C 5/025 365/230.06 |
| 2012/0168796 A1* | 7/2012 | Moon | H10K 50/865 257/E51.019 |
| 2014/0061810 A1 | 3/2014 | Sunamura et al. | |
| 2015/0055051 A1 | 2/2015 | Osawa et al. | |
| 2016/0099300 A1* | 4/2016 | Lee | H10D 86/481 257/40 |
| 2016/0211267 A1* | 7/2016 | Atsumi | H10D 87/00 |
| 2016/0246089 A1 | 8/2016 | Jeong et al. | |
| 2016/0372497 A1* | 12/2016 | Lee | H10D 86/471 |
| 2017/0077199 A1* | 3/2017 | Nguyen | H10K 77/111 |
| 2017/0207245 A1* | 7/2017 | Hanada | H02J 13/00 |
| 2017/0338249 A1 | 11/2017 | Suzumura et al. | |
| 2018/0012947 A1 | 1/2018 | Lee et al. | |
| 2018/0076102 A1 | 3/2018 | Ka et al. | |
| 2018/0151114 A1 | 5/2018 | Choi et al. | |
| 2018/0166650 A1 | 6/2018 | Hanari | |
| 2019/0006440 A1 | 1/2019 | Sun et al. | |

FOREIGN PATENT DOCUMENTS

| | | |
|---|---|---|
| JP | 5366517 | 12/2013 |
| JP | 5960000 | 8/2016 |
| KR | 10-2015-0051824 | 5/2015 |
| KR | 10-2015-0080355 | 7/2015 |
| KR | 10-2016-0027907 | 3/2016 |
| KR | 10-2017-0080223 | 7/2017 |
| KR | 10-1794856 | 11/2017 |
| KR | 10-2018-0026610 | 3/2018 |

OTHER PUBLICATIONS

Chinese Office Action for Chinese Patent Application No. 201910940709.2, dated May 22, 2024.

Korean Office Action for Korean Patent Application No. 10-2024-0097313, dated Aug. 31, 2024.

* cited by examiner

ORGANIC LIGHT EMITTING DIODE DISPLAY

CROSS-REFERENCE TO RELATED APPLICATION(S)

This is a continuation application of U.S. patent application Ser. No. 17/572,913 filed Jan. 11, 2022 (now U.S. Pat. No. 11,856,818), the disclosure of which is incorporated herein by reference in its entirety. U.S. patent application Ser. No. 17/572,913 is a continuation application of U.S. patent application Ser. No. 16/591,966 filed Oct. 3, 2019, now U.S. Pat. No. 11,257,886, issued Feb. 22, 2022, the disclosure of which is incorporated herein by reference in its entirety. U.S. patent application Ser. No. 16/591,966 claims priority to and benefit of Korean Patent Application No. 10-2018-0118769 under 35 U.S.C. § 119, filed Oct. 5, 2018, in the Korean Intellectual Property Office, the entire contents of which are incorporated herein by reference.

BACKGROUND

1. Field

The present disclosure relates to an organic light emitting diode display.

2. Description of the Related Art

An organic light emitting element of an organic light emitting diode display includes two electrodes and an organic light emitting layer positioned therebetween. Electrons injected from a cathode that is an electrode and holes injected from an anode that is another electrode are combined to each other in the organic light emitting layer to form excitons. Light is emitted while the excitons discharge energy.

As organic light emitting diode (OLED) display technology is developed, organic light emitting diode (OLED) displays are becoming high resolution. Accordingly, there is a growing need for highly integrated organic light emitting diode displays.

SUMMARY

An organic light emitting diode display according to an exemplary embodiment includes: a substrate; a first buffer layer on the substrate; a first semiconductor layer on the first buffer layer; a first gate insulating layer on the first semiconductor layer; a first gate electrode and a blocking layer on the first gate insulating layer; a second buffer layer on the first gate electrode; a second semiconductor layer on the second buffer layer; a second gate insulating layer on the second semiconductor layer; and a second gate electrode on the second gate insulating layer.

The blocking layer may overlap the second semiconductor layer.

The blocking layer may be at the same layer as the first gate electrode.

The organic light emitting diode display according to the present exemplary embodiment may further include a driving voltage line transmitting a driving voltage, and the blocking layer may be connected to the driving voltage line to receive the driving voltage.

The first semiconductor layer may include: a first channel region overlapping the first gate electrode; and a first source region and a first drain region at respective sides of the first channel region, and the second semiconductor layer may include: a second channel region overlapping the second gate electrode; and a second source region and a second drain region at respective sides of the second channel region.

The blocking layer may overlap the second channel region.

A third gate insulating layer on the second gate electrode, and a second storage electrode on the third gate insulating layer and overlapping a first storage electrode of the second gate electrode, may be further included.

A first source electrode and a first drain electrode respectively connected to the first source region and the first drain region, and a second source electrode and a second drain electrode respectively connected to the second source region and the second drain region, may be further included, and the second storage electrode may be connected to the second drain electrode.

A pixel electrode on the second storage electrode, an organic emission layer on the pixel electrode, and a common electrode on the organic emission layer may be further included, and the second drain electrode may be connected to the pixel electrode.

An encapsulation layer on the common electrode may be further included.

A first source electrode and a first drain electrode respectively connected to the first source region and the first drain region, and a second source electrode and a second drain electrode respectively connected to the second source region and the second drain region, may be further included, and the second storage electrode may be connected to the driving voltage line.

One of the first semiconductor layer and the second semiconductor layer may be an oxide semiconductor and the other may include polysilicon.

An organic light emitting diode display according to an exemplary embodiment includes: a substrate; a first transistor on the substrate; a second transistor on the first transistor; and a blocking layer under the second transistor, wherein the first transistor includes: a first semiconductor layer on the substrate; and a first gate electrode on the first semiconductor layer, wherein the blocking layer is on a layer overlying the first semiconductor layer.

A buffer layer between the first transistor and the second transistor may be further included, and the second transistor may include a second semiconductor layer on the buffer layer, and a second gate electrode on the second semiconductor layer.

The second semiconductor layer may include a channel region overlapping the second gate electrode, and a source region and a drain region at respective sides of the channel region, and the blocking layer may overlap the channel region.

The organic light emitting diode display according to the present exemplary embodiment may further include a driving voltage line transmitting a driving voltage, and the blocking layer is connected to the driving voltage line to receive the driving voltage.

The blocking layer may be in the same layer as the first gate electrode.

The first transistor may include a third gate electrode on the first gate electrode and overlapping the first gate electrode, and the blocking layer may be on the same layer as the third gate electrode.

The blocking layer may also overlap the source region and the drain region of the second semiconductor layer.

3

One of the first semiconductor layer and the second semiconductor layer may be an oxide semiconductor and the other may include polysilicon.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
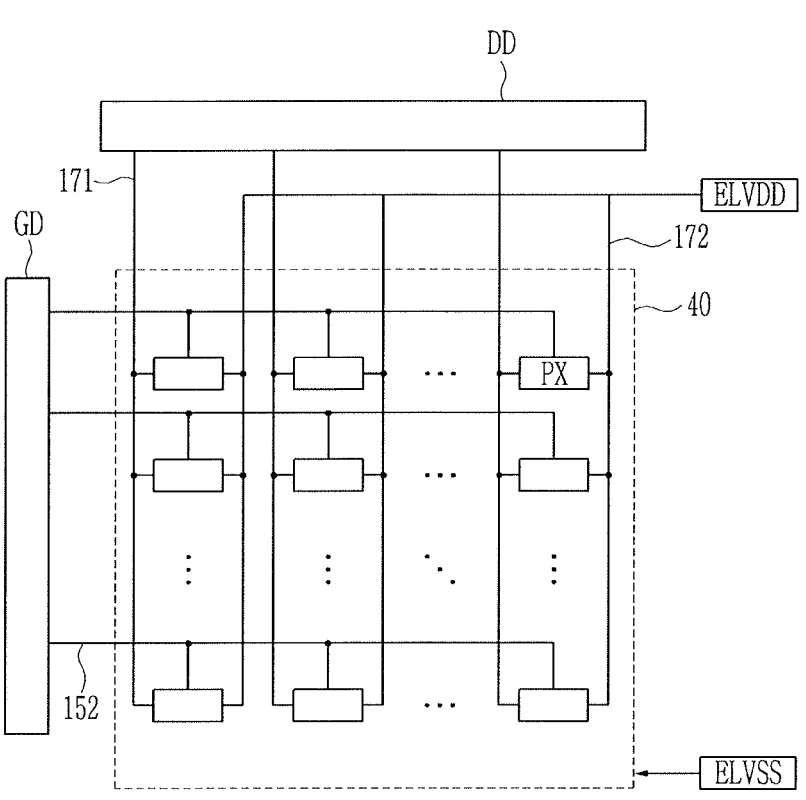
FIG. 1 illustrates an organic light emitting diode display according to an exemplary embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In order to clearly explain the embodiments, elements not directly related to thereto are omitted, and the same reference numerals are attached to the same or similar constituent elements through the entire specification.

In addition, the size and thickness of each configuration shown in the drawings are arbitrarily shown for better understanding and ease of description. In the drawings, the thickness of layers, films, panels, regions, etc., are exaggerated for clarity. In the drawings, for better understanding and ease of description, the thicknesses of some layers and areas are exaggerated.

It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, in the specification, the word "on" or "above" means positioned on or below the object portion, and does not necessarily mean positioned on the upper side of the object portion based on a gravitational direction.

In addition, unless explicitly described to the contrary, the word "comprise" and variations such as "comprises" or "comprising" will be understood to imply the inclusion of stated elements but not the exclusion of any other elements.

Further, in this specification, the phrase "on a plane" means viewing a target portion from the top, and the phrase "on a cross-section" means viewing a cross-section formed by vertically cutting a target portion from the side.

FIG. 1 is a block diagram of an organic light emitting diode display according to an exemplary embodiment. Referring to FIG. 1, the organic light emitting diode display according to an exemplary embodiment may include a gate driver GD, a data driver DD, and a pixel unit 40. The pixel unit 40 includes a plurality of pixels PX. The pixel PX means a minimum unit for displaying, and the organic light emitting diode display displays an image through the plurality of pixels PX.

The gate driver GD generates a scan signal corresponding to driving power and control signals, which are supplied from the outside, and supplies the scan signal to a gate line 152. The pixels PX are selected by the scan signal to sequentially receive a data voltage.

The gate driver GD may be a thin film transistor on a substrate along with a pixel circuit included in the pixel unit 40 or may be mounted on the substrate in a chip shape, and may be variously positioned around the pixel unit 40.

The data driver DD generates a data voltage corresponding to data and control signals, which are supplied from the outside, and supplies the data voltage to a data line 171, and may be variously positioned around the pixel unit 40. The data voltage supplied to the data line 171 is supplied to the pixel PX selected by the scan signal whenever the scan signal is supplied. According to an embodiment, the organic light emitting diode display may further include a light emission control driver that supplies a light emission control signal.

The pixel unit 40 includes a plurality of pixel PXs at the intersection of a gate line 152 and a data line 171. The pixel unit 40 receives a driving voltage ELVDD as a high potential pixel power and a common voltage ELVSS as a low potential pixel power from the outside, and the driving voltage ELVDD and the common voltage ELVSS are transmitted to each pixel PX.

The pixel PX emits light having a luminance corresponding to a driving current flowing from the driving voltage ELVDD to the common voltage ELVSS corresponding to the data voltage, thereby displaying the image.

Figure 2:
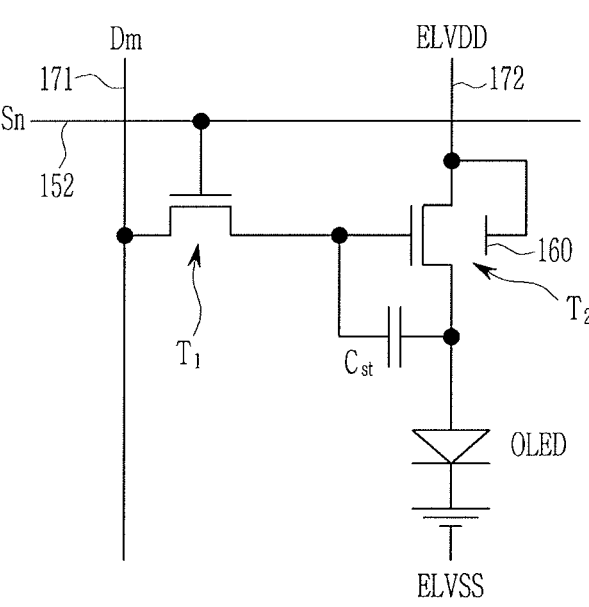
FIG. 2 illustrates an equivalent circuit diagram of one pixel of an organic light emitting diode display according to an exemplary embodiment.
Figure 3:
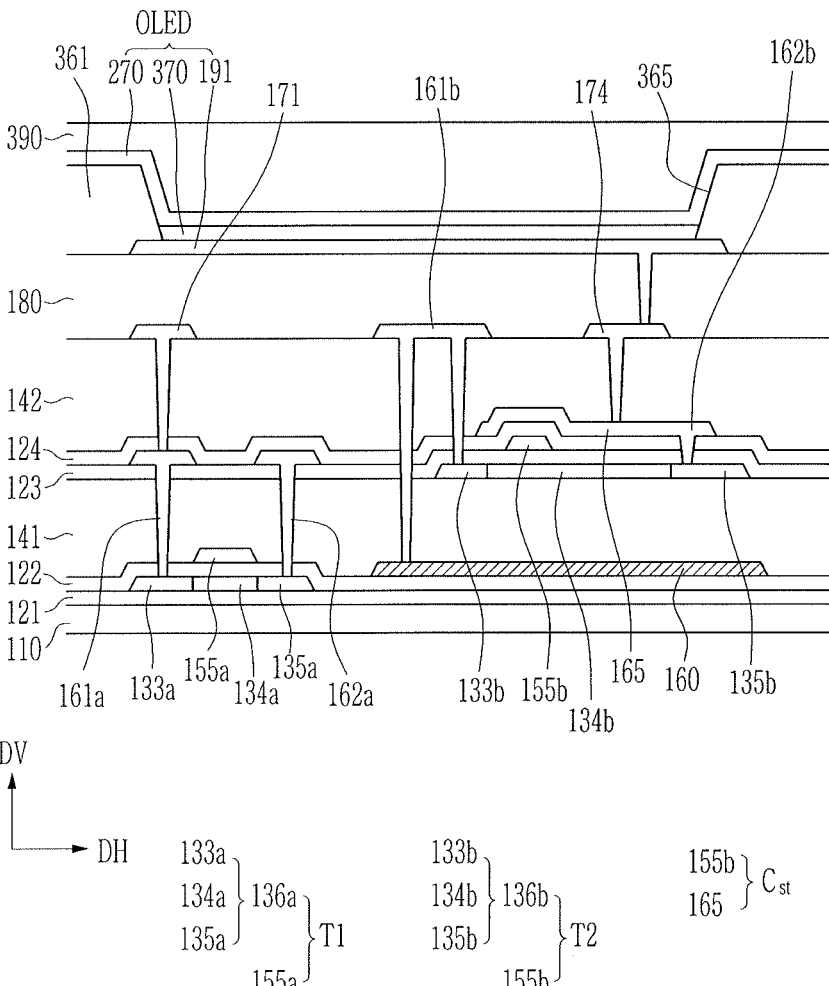
FIG. 3 illustrates a cross-sectional view of an organic light emitting diode display according to an exemplary embodiment.

Hereinafter, the organic light emitting diode display according to an exemplary embodiment will be described with reference to FIG. 2 and FIG. 3. FIG. 2 is an equivalent circuit diagram of one pixel of an organic light emitting diode display according to an exemplary embodiment. FIG. 3 illustrates a cross-sectional view of an organic light emitting diode display according to an exemplary embodiment Referring to FIG. 2, the organic light emitting diode display according to an exemplary embodiment includes a plurality of signal lines 152, 171, and 172, a plurality of transistors T1 and T2, a storage capacitor Cst, and an organic light emitting diode OLED. Also, the organic light emitting diode display according to the present exemplary embodiment includes a blocking layer 160 that overlaps the driving transistor T2 on a plane, e.g., along a vertical direction DV orthogonal to the plane, as may be seen in FIG. 3.

The signal lines 152, 171, and 172 include a gate line 152 transmitting the scan signal Sn, a data line 171 transmitting the data voltage Dm, and a driving voltage line 172 transmitting the driving voltage ELVDD. The transistors T1 and T2 include a switching transistor T1 and a driving transistor T2.

The switching transistor T1 includes a gate electrode connected to the gate line 152, a first electrode connected to the data line 171, and a second electrode connected to a gate electrode of the driving transistor T2. The second electrode of the switching transistor T1 is also connected to a first storage electrode of the storage capacitor Cst. The switching transistor T1 is connected to the gate line 152 to be turned on in response to the scan signal Sn, and when the switching transistor T1 is turned on, the data voltage Dm supplied through the data line 171 is supplied to the first storage electrode of the first storage capacitor Cst.

A first electrode of the driving transistor T2 may be connected to the driving voltage line 172 and to the blocking layer 160. The gate electrode of the driving transistor T2 may be connected to the storage capacitor Cst such that the first storage electrode receiving the first electrode driving voltage ELVDD. A second electrode of the driving transistor T2 may be connected to the first electrode of the organic light emitting diode OLED and to a second storage electrode of the storage capacitor Cst. The driving transistor T2 outputs the driving current to the organic light emitting diode OLED depending on the data voltage stored in the storage capacitor Cst.

The storage capacitor Cst includes the first storage electrode and the second storage electrode. The first storage electrode of the storage capacitor Cst is connected to the second electrode of the switching transistor T1 and to the gate electrode of the driving transistor T2. The second storage electrode of the storage capacitor Cst is connected to the second electrode of the driving transistor T2 and to the first electrode of the organic light emitting diode OLED. The storage capacitor Cst may store the data voltage Dm supplied through the switching transistor T1. The data voltage Dm stored to the storage capacitor Cst determines a magnitude of the driving current by controlling a turn-on degree of the driving transistor T2. While, FIG. 2 shows the structure including two transistors and one capacitor, one or more transistors or capacitors may be additionally included.

The organic light emitting diode OLED includes the first electrode connected to the second electrode of the driving transistor T2 and a second electrode connected to the common voltage ELVSS. The first electrode of the organic light emitting diode OLED may be an anode and the second electrode of the organic light emitting diode OLED may be a cathode. The organic light emitting diode OLED emits light depending the driving current output from the driving transistor T2 and displays a gray scale depending on a brightness degree.

The blocking layer 160 is electrically connected to the driving voltage line 172 that transmits the driving voltage ELVDD. The blocking layer 160 may be formed of a metal having a conductive characteristic or a semiconductor material having a conductive characteristic equivalent thereto. The driving voltage ELVDD is constantly applied to the blocking layer 160 to prevent the potential from being changed while a certain charge is injected into the blocking layer 160. The blocking layer 160 has a function like the second gate electrode of the driving transistor T2 in a circuit diagram. However, since the predetermined voltage is applied to the blocking layer 160, the driving transistor T2 is not turned on, but the driving transistor T2 has a predetermined characteristic.

Referring to FIG. 3, the organic light emitting diode display according to the present exemplary embodiment includes a substrate 110, the switching transistor T1, the driving transistor T2, and the organic light emitting diode OLED.

The substrate 110 may include a flexible material that may be bent, curved, and folded such as plastic. For example, the substrate 110 may be made of a polymer, e.g., polyimide, polyamide, polycarbonate, polyethylene terephthalate, or the like. The substrate 110 may be a rigid substrate made of a material such as glass.

A first buffer layer 121 is on the substrate 110. The first buffer layer 121 may include a silicon nitride ($SiN_x$), a silicon oxide ($SiO_x$), etc. As the first buffer layer 121 is between the substrate 110 and a first semiconductor layer 136a, an impurity is prevented from being diffused into the first semiconductor layer 136a from the substrate 110 and planarizes the substrate 110, thereby alleviating stress on the first semiconductor layer 136a formed on the first buffer layer 121.

The first semiconductor layer 136a is on the first buffer layer 121. The first semiconductor layer 136a may be made of a polysilicon. For example, the first semiconductor layer 136a may be made of a polysilicon formed by crystallizing amorphous silicon by a crystallization method such as excimer laser annealing (ELA). The first semiconductor layer 136a may include a first channel region 134a, a first source region 133a, and a first drain region 135a. The first source region 133a and the first drain region 135a are on respective sides of the first channel region 134a. The first channel region 134a is an intrinsic semiconductor in which an impurity is not doped, and the first source region 133a and the first drain region 135 are impurity semiconductors in which a conductive impurity is doped. The conductive impurity may be a P-type impurity.

A first gate insulating layer 122 is on the first semiconductor layer 136a. The first gate insulating layer 122 may be a single layer including at least one of a silicon nitride ($SiN_x$), a silicon oxide ($SiO_x$), a multilayer thereof, or the like.

A first gate electrode 155a and the blocking layer 160 are on, e.g., directly on, the first gate insulating layer 122. The blocking layer 160 is in the same layer as the first gate electrode 155a, e.g., directly on the first gate insulating layer 122, but may be closer to the substrate 110 along the vertical direction DV due to the first semiconductor layer 136a being between the first gate electrode 155a and the substrate 110.

The first gate electrode 155a may be a multilayer including a metal layer which includes at least one of copper (Cu), a copper alloy, aluminum (Al), an aluminum alloy, molybdenum (Mo), and a molybdenum alloy. The first gate electrode 155a and the first semiconductor layer 136a may configure the switching transistor T1.

The blocking layer 160 is formed together in the same layer as the first gate electrode 155a, e.g., without an additional mask process, thereby simplifying the process. The blocking layer 160 is electrically connected to the driving voltage line 172 through an opening to receive the driving voltage ELVDD. The blocking layer 160 may be formed of a metal having a conductive characteristic, or a semiconductor material having a conductive characteristic equivalent thereto.

A second buffer layer 141 is on the first gate electrode 155a, the blocking layer 160, and the first gate insulating layer 122. The second buffer layer 141 may include a silicon nitride ($SiN_x$), a silicon oxide ($SiO_x$), etc. The second buffer layer 141 has openings respectively exposing the first source region 133a and the first drain region 135a, as well as the blocking layer 160.

The second semiconductor layer 136b is on the second buffer layer 141. The second semiconductor layer 136b includes a second channel region 134b, a second source region 133*b*, and a second drain region 135*b*. The second source region 133*b* and the second drain region 135*b* are on respective sides of the second channel region 134*b*.

The second semiconductor layer 136*b* may be made of an oxide semiconductor. Although the first semiconductor layer 136*a* is made of the polysilicon and the second semiconductor layer 136*b* is the oxide semiconductor, the first semiconductor layer 136*a* of the switching transistor T1 may be formed of the oxide semiconductor having an off current characteristic that is better than that of the polysilicon, and the second semiconductor layer 136*b* of the driving transistor T2 may be formed of the polysilicon. Alternatively, both the first semiconductor layer 136*a* and the second semiconductor layer 136*b* may be made of the same material, e.g., polysilicon or oxide semiconductor.

A second gate insulating layer 123 is on the second semiconductor layer 136*b*. The second gate insulating layer 123 may be a single layer including at least one of a silicon nitride (SiN$_x$), a silicon oxide (SiO$_x$), the multilayer, or the like.

A first source electrode 161*a* and a first drain electrode 162*a* are on the second gate insulating layer 123. The first source electrode 161*a* and the first drain electrode 162*a* are respectively connected to the first source region 133*a* and the first drain region 135*a* of the first semiconductor layer 136*a* through the openings formed in the first gate insulating layer 122, the second buffer layer 141, and the second gate insulating layer 123.

A second gate electrode 155*b* overlapping the second channel region 134*b* is also on the second gate insulating layer 123. The second gate electrode 155*b* may be a multilayer including a metal layer which includes at least one of copper (Cu), a copper alloy, aluminum (Al), an aluminum alloy, molybdenum (Mo), a molybdenum alloy, or the like. The second gate electrode 155*b* and the second semiconductor layer 136*b* may configure the driving transistor T2.

In the organic light emitting diode display according to the present exemplary embodiment, the switching transistor T1 and the driving transistor T2 are on the different layers. In other words, the first semiconductor layer 136*a* of the switching transistor T1 and the second semiconductor layer 136*b* of the driving transistor T2 are on the different layers. Therefore, an interval along a horizontal direction DH between the switching transistor T1 and the driving transistor T2 may be narrowed or these transistors may partially overlap along the vertical direction DV, thereby increasing a degree of design freedom, increasing an aperture ratio of the pixel, and/or increasing the resolution of the display device.

The blocking layer 160 may overlap the second channel region 134*b* of the driving transistor T2 along the vertical direction DV. The blocking layer 160 may also overlap the second source region 133*b* and the second drain region 135*b* at respective sides of the second channel region 134*b*, e.g., may overlap an entirety of the second semiconductor layer 136*b*. Also, the blocking layer 160 may not overlap the first channel region 134*a* of the switching transistor T1. As the blocking layer 160 is under the driving transistor T2, a kickback voltage due to a parasitic capacitance of the switching transistor T1 and the driving transistor T2 may be minimized, and the display quality of the organic light emitting diode display may be improved by preventing a residual image, as described in detail below. In addition, the blocking layer 160 below the second semiconductor layer 136*b* is not floated, but receives the driving voltage ELVDD, e.g., may extend beyond the second semiconductor layer 136*b* along the horizontal direction DH to receive the driving voltage ELVDD, thereby preventing deterioration of the display quality due to the unnecessary parasitic capacitance.

A third gate insulating layer 124 is on the second gate insulating layer 123, the first source electrode 161*a*, the first drain electrode 162*a*, and the second gate electrode 155*b*. A second drain electrode 162*b* and a second storage electrode 165 that extends from the second drain electrode 162*b* along the horizontal direction DH are on the third gate insulating layer 124.

The second drain electrode 162*b* is connected to the second drain region 135*b* of the driving transistor T2 through the opening formed in the second gate insulating layer 123 and the third gate insulating layer 124. The second storage electrode 165 extends from the second drain electrode 162*b* along the horizontal direction DH to overlap the second gate electrode 155*b*. The second gate electrode 155*b* and the second storage electrode 165 overlap each other along the vertical direction DV via the third gate insulating layer 124 to form the storage capacitor Cst. In this case, the second gate electrode 155*b* may be the first storage electrode of the storage capacitor Cst. The third gate insulating layer 124 is a dielectric material, and the storage capacitance is determined by the charge charged in the storage capacitor Cst and the voltage between the first storage electrode 155*b* and the second storage electrode 165.

An interlayer insulating layer 142 is on the third gate insulating layer 124 and the second storage electrode 165. The interlayer insulating layer 142 may be the single layer including at least one of a silicon nitride (SiN$_x$) a silicon oxide (SiO$_x$), the multilayer, or the like.

A second source electrode 161*b* and a connecting member 174 are on the interlayer insulating layer 142. The second source electrode 161*b* is connected to the second source region 133*b* of the second semiconductor layer 136*b* through the opening in the interlayer insulating layer 142, the second gate insulating layer 123, and the third gate insulating layer 124. The connecting member 174 is connected to the second drain electrode 162*b* of the driving transistor T2 and the second storage electrode 165 of the storage capacitor Cst through the opening in the interlayer insulating layer 142.

The second source electrode 161*b* extends and is connected to the driving voltage line 172 to receive the driving voltage ELVDD. The second source electrode 161*b* is also connected to the blocking layer 160 through the opening in the second buffer layer 141, the second gate insulating layer 123, the third gate insulating layer 124, and the interlayer insulating layer 142. Accordingly, the blocking layer 160 is not floated and receives the driving voltage ELVDD.

The data line 171 is also on the interlayer insulating layer 142. The data line 171 is connected to the first source electrode 161*a* of the switching transistor T1 through the opening in the third gate insulating layer 124 and the interlayer insulating layer 142 to transmit the data voltage to the switching transistor T1.

A passivation layer 180 is on the interlayer insulating layer 142, the data line 171, the second source electrode 161*b*, and the connecting member 174. The passivation layer 180 covers the interlayer insulating layer 142, the second source electrode 161*b*, the data line 171, and the connecting member 174 to provide a flat upper surface so that a pixel electrode 191 may be formed without a step on the passivation layer 180. The passivation layer 180 may be formed of an organic material, e.g., a polyacrylate resin, a polyimide resin, or the like, or a laminated film of an organic material and an inorganic material.

The pixel electrode 191 is on the passivation layer 180. The pixel electrode 191 is connected to the connecting member 174 through the opening formed in the passivation layer 180. Accordingly, the pixel electrode 191 is connected to the second drain electrode 162*b* of the driving transistor T2 through the connecting member 174. The driving transistor T2 is connected to the pixel electrode 191 to supply the driving current to the organic light emitting element.

A partition wall 361 covers the passivation layer 180 and the pixel electrode 191, and has a pixel opening 365 exposing the pixel electrode 191. The partition wall 361 may include an organic material, e.g., a polyacrylate resin, a polyimide resin, or the like, or an inorganic material, e.g., a silica-based inorganic material.

An organic emission layer 370 is on the pixel electrode 191 exposed by the pixel opening 365. The organic emission layer 370 may be formed of a low molecular organic material and a high molecular organic material such as or PEDOT (poly(3,4-ethylenedioxythiophene)), etc. Also, the organic emission layer 370 may be a multilayer further including at least one among a hole injection layer (HIL), a hole transporting layer (HTL), an electron transporting layer (ETL), an electron injection layer (EIL), or the like. The organic emission layer 370 may include a red organic emission layer emitting red light, a green organic emission layer emitting green light, and a blue organic emission layer emitting blue light.

A common electrode 270 is on the organic emission layer 370. The common electrode 270 may cover a plurality of pixels. The pixel electrode 191, the organic emission layer 370, and the common electrode 270 may form the organic light emitting diode OLED.

Here, the pixel electrode 191 may be the anode of the hole injection electrode, and the common electrode 270 may be the cathode of the electron injection electrode. Alternatively, depending on a driving method of the organic light emitting diode display, the pixel electrode 191 may be the cathode and the common electrode 270 may be the anode. Holes and electrons are respectively injected from the pixel electrode 191 and the common electrode 270 into the organic emission layer 370, and light is emitted when excitons which are combinations of the injected holes and electrons fall from an excited state to a ground state.

An encapsulation layer 390 is on the common electrode 270. The thin film encapsulation layer 390 encapsulates the organic light emitting diode OLED, thereby preventing penetration of external moisture and oxygen, as the organic light emitting diode OLED is very vulnerable to the moisture and oxygen. The encapsulation layer 390 may include a plurality of layers, and may be formed of a composite film including both an inorganic film and an organic film. The encapsulation layer 390 may be formed of a triple layer in which an inorganic film, an organic film, and an inorganic film are sequentially formed.

Figure 4:
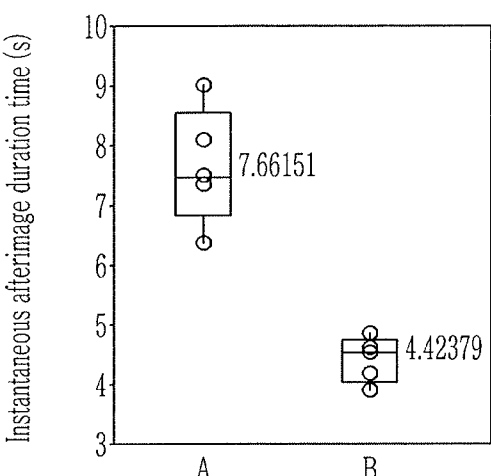
FIG. 4 illustrates a graph showing an instantaneous after-image duration of an organic light emitting diode display according to a comparative example and an exemplary embodiment.

FIG. 4 is a graph showing an instantaneous afterimage duration of an organic light emitting diode display according to a comparative example and an exemplary embodiment. In FIG. 4, A represents the organic light emitting diode display according to the comparative example without a blocking layer, and B represents the organic light emitting diode display including a blocking layer that overlaps the channel region of the driving transistor according to an exemplary embodiment.

In the organic light emitting diode display, if black and white are displayed for 10 seconds and then a low gray is simultaneously driven, a difference in luminance occurs in the region displaying black and the region displaying white even though the same colors are driven. In detail, the region displaying black is brighter than the gray to be driven immediately after the gray driving of the low gray, and the region displaying white is darker than the gray to be driven. The instantaneous afterimage means an afterimage recognized by the luminance difference.

The duration of the instantaneous afterimage of FIG. 4 is found by measuring the time that the difference in luminance between the region displaying black from immediately after the gray driving of the low gray and the region displaying white reaches 0.4%. Here, the luminance difference is calculated by $(B-W)/(B+W)$, where B is the luminance of the region displaying black and W is the luminance of the region displaying white. The instantaneous afterimage is directly related to the display quality of the display device, so that if the duration of the instantaneous afterimage is reduced, a clearer image may be achieved. This instantaneous afterimage may be improved by minimizing vertical cross-talk between the transistors in the organic light emitting diode display.

Referring to FIG. 4, in the case A, the instantaneous afterimage lasts for 7.66151 seconds. However, in the case B, the instantaneous afterimage lasts for only 4.42379 seconds. Accordingly, an organic light emitting diode display including the blocking layer according to embodiments improves the instantaneous afterimage by about 3.2 seconds compared with the organic light emitting diode display (the comparative example) without the blocking layer.

Figure 5:
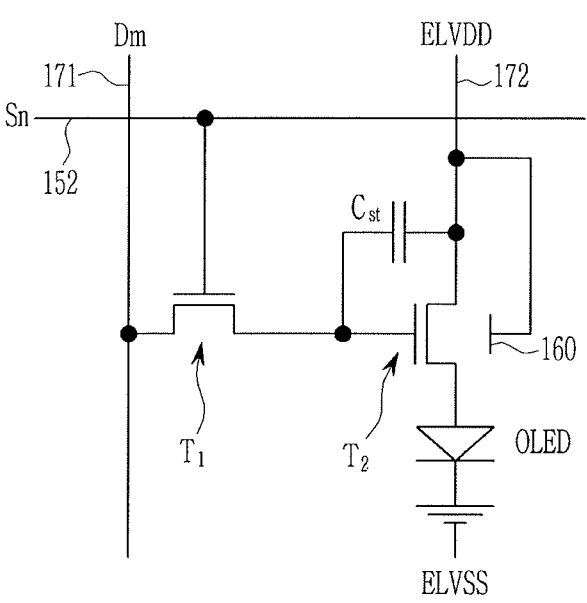
FIG. 5 illustrates an equivalent circuit diagram of one pixel of an organic light emitting diode display according to another exemplary embodiment.

Next, the organic light emitting diode display according to an exemplary embodiment will be described with reference to FIG. 5 and FIG. 6. FIG. 5 is an equivalent circuit diagram of one pixel of an organic light emitting diode display according to another exemplary embodiment.

Referring to FIG. 5, the organic light emitting diode display according to an exemplary embodiment includes signal lines 152, 171, and 172, two transistors T1 and T2, the storage capacitor Cst, and the organic light emitting diode OLED. Also, the organic light emitting diode display according to the present exemplary embodiment includes the blocking layer 160 that overlaps the driving transistor T2 on a plane, e.g., along the vertical direction DV. Except for the second storage electrode of the storage capacitor Cst, which is connected to the driving voltage line 172 and the first electrode of the driving transistor T2, this embodiment is similar to that of FIG. 2, and redundant description is not repeated.

The storage capacitor Cst includes the first storage electrode and the second storage electrode. The first storage electrode of the storage capacitor Cst is connected to the second electrode of the switching transistor T1 and the gate electrode of the driving transistor T2. The second storage electrode of the storage capacitor Cst is connected to the driving voltage line 172. The second storage electrode of the storage capacitor Cst is also connected to the first electrode of the driving transistor T2 and the blocking layer 160.

The storage capacitor Cst may store the data voltage Dm supplied through the switching transistor T1. The data voltage Dm stored in the storage capacitor Cst determines the magnitude of the driving current by adjusting the degree to which the driving transistor T2 turns on.

The blocking layer 160 is electrically connected to the driving voltage line 172 that transmits the driving voltage ELVDD. The driving voltage ELVDD is constantly applied to the blocking layer 160 to prevent the potential from being changed while a certain charge is injected into the blocking layer 160. The blocking layer 160 has a function like the second gate electrode of the driving transistor T2 in a circuit diagram. However, since the predetermined voltage is applied to the blocking layer 160, the driving transistor T2 is not turned on, but the driving transistor T2 has a predetermined characteristic.

Figure 6:
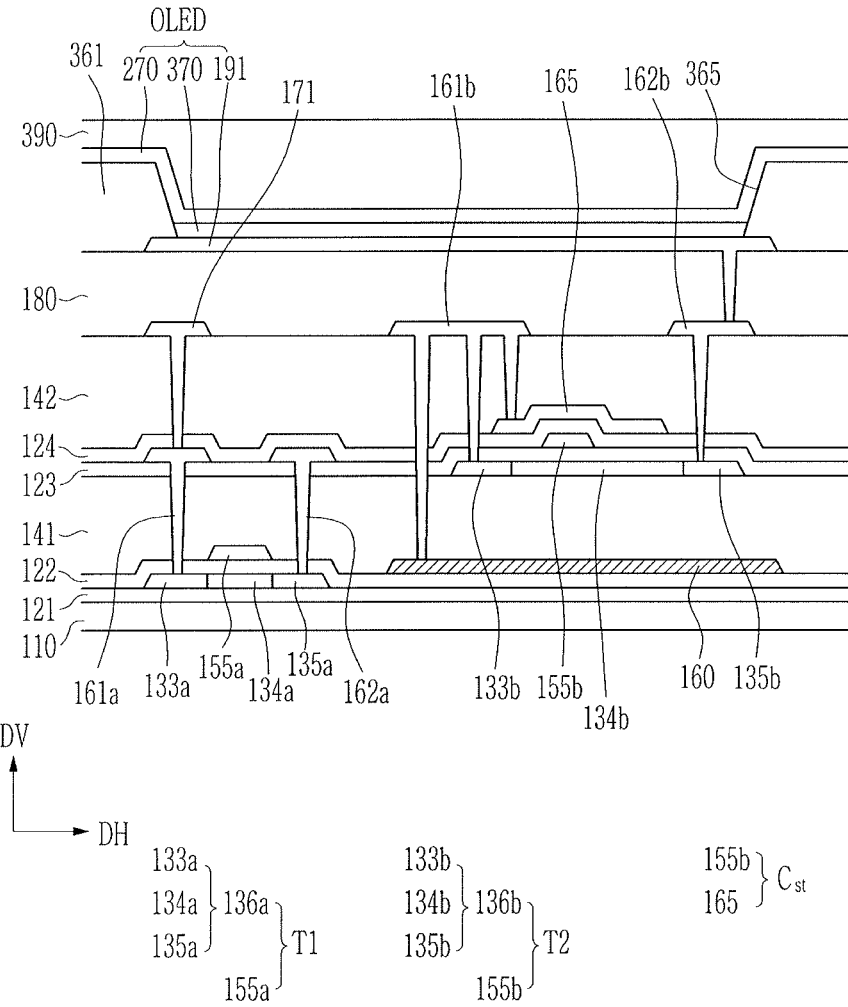
FIG. 6 illustrates a cross-sectional view of an organic light emitting diode display according to another exemplary embodiment.

FIG. 6 is a cross-sectional view of an organic light emitting diode display according to another exemplary embodiment. The configuration of FIG. 6 is similar to that of FIG. 3 such that the detailed description overlapping with FIG. 3 is not repeated.

Referring to FIG. 6, the organic light emitting diode display according to the present exemplary embodiment includes the substrate 110, the switching transistor T1, the driving transistor T2, and the organic light emitting diode OLED.

The second source electrode 161*b* extends and is connected to the driving voltage line 172 to receive the driving voltage ELVDD. The second source electrode 161*b* is also connected to the blocking layer 160 through the opening in the second buffer layer 141, the second gate insulating layer 123, the third gate insulating layer 124, and the interlayer insulating layer 142. Accordingly, the blocking layer 160 is not floated and receives the driving voltage ELVDD.

Additionally, different from FIG. 3, the second source electrode 161*b* is also connected to the second storage electrode 165 of the storage capacitor Cst through the opening formed in the interlayer insulating layer 142, and the second storage electrode 165 is not connected to the second drain electrode 162*b*. Accordingly, the second storage electrode 165 of the storage capacitor Cst receives the driving voltage ELVDD. Otherwise, the remainder of the structure is the same as in FIG. 3.

Figure 7:
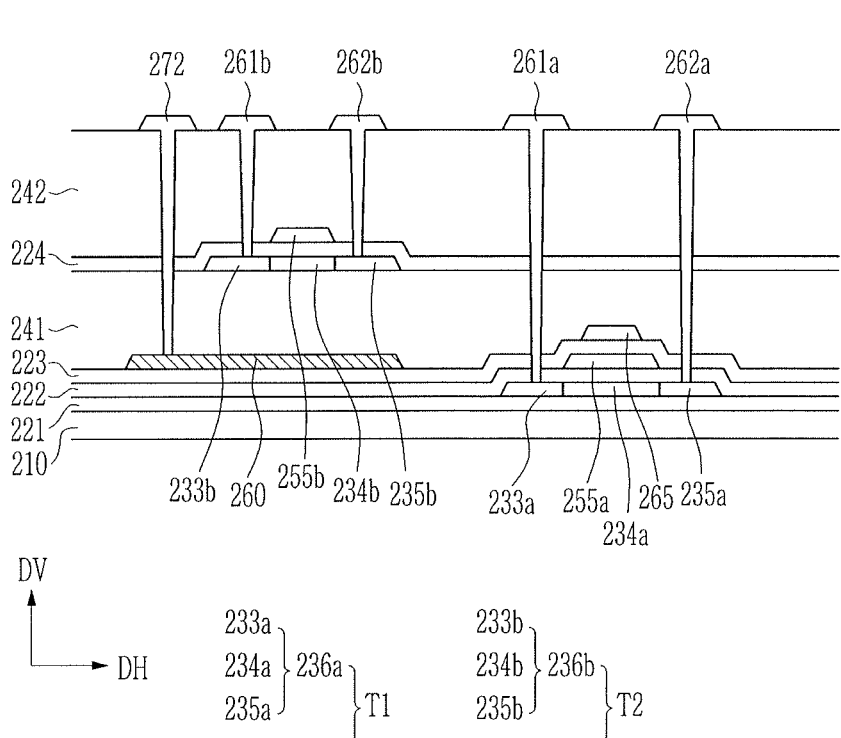
FIG. 7 illustrates a cross-sectional view of an organic light emitting diode display according to another exemplary embodiment.

FIG. 7 is a cross-sectional view of an organic light emitting diode display according to another exemplary embodiment. Referring to FIG. 7, the organic light emitting diode display according to the present exemplary embodiment includes the first transistor T1, the second transistor T2, and a blocking layer 260.

The organic light emitting diode display according to the present exemplary embodiment includes a substrate 210 and a first buffer layer 221 on the substrate 210.

A first semiconductor layer 236*a* is on the first buffer layer 221. The first semiconductor layer 236*a* may be made of polysilicon, and includes a first channel region 234*a*, a first source region 233*a*, and a first drain region 235*a*. The first source region 233*a* and the first drain region 235*a* are at respective sides of the first channel region 234*a*.

A first gate insulating layer 222 is on the first semiconductor layer 236*a* and a first gate electrode 255*a* is on the first gate insulating layer 222. The first gate electrode 255*a* overlaps the first channel region 234*a* of the first semiconductor layer 236*a*. The first gate electrode 255*a* and the first semiconductor layer 236*a* may form the first transistor T1.

A second gate insulating layer 223 is on the first gate electrode 255*a*. A second gate electrode 265 and the blocking layer 260 are on the second gate insulating layer 223. The second gate electrode 265 overlaps the first gate electrode 255*a* and the first channel region 234*a* of the first semiconductor layer 236*a* along the vertical direction DV. Along the vertical direction DV, the first gate electrode 255*a* and the second gate electrode 265 overlap and are spaced apart by the second gate insulating layer 223, thereby forming the storage capacitor.

The blocking layer 260 is in the same layer, e.g., directly on the second gate insulating layer 223, as the second gate electrode 265, but may be closer to the substrate 210 along the vertical direction DV due to the first semiconductor layer 236*a* being between the second gate electrode 265 and the substrate 210. The blocking layer 260 is electrically connected to a driving voltage line 272 through the opening to receive the driving voltage ELVDD. The blocking layer 260 may be formed of the metal having the conductive characteristic or the semiconductor material having the conductive characteristic equivalent thereto.

A second buffer layer 241 is on the second gate electrode 265, the blocking layer 260, and the second gate insulating layer 223. A second semiconductor layer 236*b* is on the second buffer layer 241. The second semiconductor layer 236*b* includes a second channel region 234*b*, a second source region 233*b*, and a second drain region 235*b*. The second source region 233*b* and the second drain region 235*b* are at respective sides of the second channel region 234*b*. The second semiconductor layer 236*b* may be made of the oxide semiconductor.

A third gate insulating layer 224 is on the second semiconductor layer 236*b*. A third gate electrode 255*b* overlapping the second channel region 234*b* is on the third gate insulating layer 224. The third gate electrode 255*b* and the second semiconductor layer 236*b* may form the second transistor T2.

The blocking layer 260 overlaps the second channel region 234*b* of the second transistor T2. The blocking layer 260 may also overlap the second source region 233*b* and the second drain region 235*b* at respective sides of the second channel region 234*b*, e.g., may overlap an entirety of the second semiconductor layer 236*b*. Also, the blocking layer 260 may not overlap the first channel region 234*a* of the first transistor T1.

It is described that the first semiconductor layer 236*a* of the first transistor T1 is made of the polysilicon and the second semiconductor layer 236*b* of the second transistor T2 is made of the oxide semiconductor, but it is possible for the first semiconductor layer 236*a* to be made of the oxide semiconductor and the second semiconductor layer 236*b* to be made of the polysilicon. Alternatively, both the first semiconductor layer 236*a* and the second semiconductor layer 236*b* may be made of the same material, e.g., polysilicon or oxide semiconductor.

An interlayer insulating layer 242 is on the third gate electrode 255*b* and the third gate insulating layer 224. A first source electrode 261*a*, a first drain electrode 262*a*, a second source electrode 261*b*, a second drain electrode 262*b*, and the driving voltage line 272 are on the interlayer insulating layer 242.

The first source electrode 261*a* and the first drain electrode 262*a* are respectively connected to the first source region 233*a* and the first drain region 235*a* of the first semiconductor layer 236*a* through the openings in the second buffer layer 241, first to third gate insulating layers 222 to 224, and the interlayer insulating layer 242.

Further, the second source electrode 261*b* and the second drain electrode 262*b* are respectively connected to the second source region 233*b* and the second drain region 235*b* of the second semiconductor layer 236*b* through the openings in the interlayer insulating layer 242 and the third gate insulating layer 224.

Finally, the driving voltage line 272 is connected to the blocking layer 260 through the opening in the second buffer layer 241, the interlayer insulating layer 242, and the third gate insulating layer 224.

By way of summation and review, embodiments herein may provide an organic light emitting diode display having increased design freedom, high resolution, and improved display quality.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An organic light emitting diode display, comprising:
a substrate;
a first buffer layer on the substrate;
a first semiconductor layer on the first buffer layer;
a first gate insulating layer on the first semiconductor layer;
a first gate electrode on the first gate insulating layer;
a second gate insulating layer on the first gate electrode;
an upper electrode and a blocking layer on the second gate insulating layer, the upper electrode being spaced apart from the blocking layer along a direction parallel to a surface of the substrate, and the upper electrode and the blocking layer including a same material as each other;
a second buffer layer on and over a topmost surface of both the upper electrode and the blocking layer, the second buffer layer contacting the topmost surface of the upper electrode and the blocking layer;
a second semiconductor layer on the second buffer layer, the second semiconductor layer including a channel region;
a third gate insulating layer on the second semiconductor layer;
a second gate electrode on the third gate insulating layer;
a passivation layer on the second gate electrode;
a pixel electrode on the passivation layer;
an organic emission layer on the pixel electrode; and
a common electrode on the organic emission layer, wherein
the blocking layer is disposed in a same layer as the upper electrode, the blocking layer overlapping the channel region of the second semiconductor layer in a direction perpendicular to the surface of the substrate,
the first semiconductor layer comprises polysilicon, and the second semiconductor layer comprises an oxide semiconductor, and
the upper electrode overlaps a center of the first gate electrode along the direction perpendicular to the surface of the substrate.

2. The organic light emitting diode display as claimed in claim 1, further comprising:
an interlayer insulating layer on the second gate electrode and below the passivation layer; and
a first electrode and a second electrode on the interlayer insulating layer, wherein
the first electrode is in contact with the first semiconductor layer, and
the second electrode is in contact with the second semiconductor layer.

3. The organic light emitting diode display as claimed in claim 2, wherein the first electrode and the second electrode are in contact with a top surface of the interlayer insulating layer.

4. The organic light emitting diode display as claimed in claim 3, further comprising:
a driving voltage line transmitting a driving voltage,
wherein the blocking layer is electrically connected to the driving voltage line.

5. The organic light emitting diode display as claimed in claim 2, wherein the upper electrode overlaps the first gate electrode in a direction perpendicular to the surface of the substrate.

6. The organic light emitting diode display as claimed in claim 2, wherein
the passivation layer is on the first electrode and the second electrode.

7. The organic light emitting diode display as claimed in claim 6, wherein the pixel electrode is electrically connected to the second electrode.

8. The organic light emitting diode display as claimed in claim 7, further comprising:
an encapsulation layer on the common electrode.

9. The organic light emitting diode display as claimed in claim 1, wherein the blocking layer comprises a same material as the upper electrode.

10. The organic light emitting diode display as claimed in claim 1, wherein the blocking layer is electrically conductive.

11. The organic light emitting diode display as claimed in claim 1, wherein the blocking layer does not overlap the upper electrode in a direction perpendicular to the surface of the substrate.

12. The organic light emitting diode display as claimed in claim 1, further comprising a driving voltage line transmitting a driving voltage,
wherein the blocking layer is electrically connected to the driving voltage line.

13. The organic light emitting diode display as claimed in claim 12, further comprising an interlayer insulating layer disposed on the second gate electrode,
wherein the driving voltage line is disposed on the interlayer insulating layer.

14. The organic light emitting diode display as claimed in claim 1, wherein the blocking layer is comprised of a metal having a conductive characteristic.

15. The organic light emitting diode display as claimed in claim 1, wherein the blocking layer reduces a kickback voltage due to parasitic capacitance of a first transistor and a second transistor, and
the first transistor comprises the first semiconductor layer and the first gate electrode and the second transistor comprises the second semiconductor layer and the second gate electrode.

16. The organic light emitting diode display as claimed in claim 1, wherein the blocking layer is connected to a driving voltage line to receive a driving voltage.

17. The organic light emitting diode display as claimed in claim 1, wherein
the first gate insulating layer is disposed directly on the first semiconductor layer,
the first gate electrode is disposed directly on the first gate insulating layer,
the second gate insulating layer is disposed directly on the first gate electrode, and
the upper electrode and the blocking layer are both disposed directly on a top surface of the second gate insulating layer, the top surface of the second gate insulating layer facing away from the substrate,
the second semiconductor layer is disposed directly on the second buffer layer, the third gate insulating layer is disposed directly on the second semiconductor layer, and the second gate electrode is disposed directly on the third gate insulating layer.

18. The organic light emitting diode display as claimed in claim 1, further comprising pixels disposed on the substrate, wherein the first semiconductor layer and the second semiconductor layer are both disposed directly between the pixels as seen from a plan view.

* * * * *